(12) United States Patent
Hu

(10) Patent No.: US 12,433,102 B2
(45) Date of Patent: Sep. 30, 2025

(54) DISPLAY PANEL AND MANUFACTURING METHOD THEREOF

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventor: Kai Hu, Huizhou (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/621,250

(22) PCT Filed: Nov. 24, 2021

(86) PCT No.: PCT/CN2021/132883
§ 371 (c)(1),
(2) Date: Dec. 21, 2021

(87) PCT Pub. No.: WO2023/087347
PCT Pub. Date: May 25, 2023

(65) Prior Publication Data
US 2024/0040833 A1     Feb. 1, 2024

(30) Foreign Application Priority Data
Nov. 17, 2021    (CN) .......................... 202111361069.3

(51) Int. Cl.
*H10K 59/12*      (2023.01)
*H10K 59/121*     (2023.01)
*H10K 59/124*     (2023.01)

(52) U.S. Cl.
CPC ..... *H10K 59/1213* (2023.02); *H10K 59/1201* (2023.02); *H10K 59/124* (2023.02)

(58) Field of Classification Search
CPC ...... H10D 86/40; H10D 86/60; H10D 86/425; H10D 86/427; H10D 86/431;
(Continued)

(56) References Cited

U.S. PATENT DOCUMENTS

| | | | |
|---|---|---|---|
| 8,058,645 | B2 | 11/2011 | Jeong et al. |
| 2012/0319102 | A1 | 12/2012 | Yamazaki |

(Continued)

FOREIGN PATENT DOCUMENTS

| | | |
|---|---|---|
| CN | 102969362 | 3/2013 |
| CN | 107331698 | 11/2017 |
| CN | 109585455 | 4/2019 |
| CN | 109742151 | 5/2019 |
| CN | 112864231 | 5/2021 |
| CN | 113571533 | 10/2021 |

OTHER PUBLICATIONS

Notification of Office Action and Search Report Dated Apr. 17, 2025 From The State Intellectual Property Office of the People's Republic of China Re. Application No. 202111361069.3 and Its Translation Into English. (22 Pages).

*Primary Examiner* — Moin M Rahman (57) ABSTRACT

The present application discloses a display panel and a manufacturing method thereof. The display panel includes a substrate, a first gate, a first gate insulating layer, an active layer, an interlayer dielectric layer, a first via, a second via, a source, and a drain; the active layer is disposed on the substrate, the active layer includes at least a first sub-active layer and a second sub-active layer stacked, the second sub-active layer is disposed on a side of the first sub-active layer away from the substrate, and a number of gallium atoms in the first sub-active layer is greater than a number of gallium atoms in the second sub-active layer.

12 Claims, 8 Drawing Sheets

(58) Field of Classification Search
CPC ....... H10D 86/471; H10D 30/67–6759; H10D 30/031–0327; H10D 86/021–0251; H10D 86/423; H10D 86/0221; H10D 86/481; H10D 86/441; H10D 64/62; H10D 62/80; H10D 99/00; H10D 30/6713; H10K 10/46–491; H10K 59/1213; H10K 59/1201; H10K 59/124; H10K 59/122; C23C 14/35; G02F 1/1343; G02F 1/13363; G03F 5/16; H01L 21/02565; H01L 21/02631; H01L 21/0274; H01L 21/443; H01L 21/77

See application file for complete search history.

(56) References Cited

U.S. PATENT DOCUMENTS

| | | | |
|---|---|---|---|
| 2014/0084286 A1* | 3/2014 | Jeon | H01L 27/124 438/34 |
| 2015/0008428 A1* | 1/2015 | Yamamoto | H10D 30/6734 257/43 |
| 2015/0263728 A1 | 9/2015 | Ohmaru | |
| 2015/0349133 A1* | 12/2015 | Yamazaki | H10D 30/673 257/43 |
| 2017/0330938 A1* | 11/2017 | Baeck | H10D 30/6723 |
| 2022/0199830 A1* | 6/2022 | Zhang | H10D 30/6755 |

* cited by examiner

DISPLAY PANEL AND MANUFACTURING METHOD THEREOF

RELATED APPLICATIONS

This application is a National Phase of PCT Patent Application No. PCT/CN2021/132883 having International filing date of Nov. 24, 2021, which claims the benefit of priority of Chinese Patent Application No. 202111361069.3 filed on Nov. 17, 2021. The contents of the above applications are all incorporated by reference as if fully set forth herein in their entirety.

FIELD AND BACKGROUND OF THE INVENTION

The present disclosure relates to a field of display technology, and in particular to a display panel and a manufacturing method thereof.

Currently, it is commonly used that an active layer is disposed as a single film layer of indium gallium zinc oxide. As oxygen flow is greater during a film formation process, oxygen content in the indium gallium zinc oxide film layer is great, resulting in poor conductivity and low mobility of a device. If oxygen flow during deposition is less, the oxygen content in the indium gallium zinc oxide film layer is small. More oxygen vacancies will cause more defects at an interface between a first gate insulating layer and the indium gallium zinc oxide film layer and an interface between a second gate insulating layer and the indium gallium zinc oxide film layer, resulting in poor stability of the device.

Therefore, it is necessary to propose a new technical solution to solve above technical problems.

SUMMARY OF THE INVENTION

Embodiments of the present disclosure provide a display panel and a manufacturing method thereof for improving stability of the display panel.

An embodiment of the present disclosure provides a display panel, comprising:
  a substrate;
  a first gate disposed on the substrate;
  a first gate insulating layer disposed on the substrate;
  an active layer disposed on the substrate, wherein the active layer and the first gate are disposed in different layers, the active layer comprises at least a first sub-active layer and a second sub-active layer stacked, the first sub-active layer is disposed on the substrate, the second sub-active layer is disposed on a side of the first sub-active layer away from the substrate, and a number of gallium atoms in the first sub-active layer is greater than a number of gallium atoms in the second sub-active layer;
  an interlayer dielectric layer disposed on the substrate;
  a first via penetrating at least the interlayer dielectric layer;
  a second via penetrating at least the interlayer dielectric layer;
  a source disposed on the interlayer dielectric layer and electrically connected to the active layer through the first via; and
  a drain disposed on the interlayer dielectric layer and electrically connected to the active layer through the second via.

In the display panel provided in the embodiment of the present disclosure, the active layer further comprises:
  a third sub-active layer disposed on the second sub-active layer, and a number of gallium atoms in the third sub-active layer is greater than the number of gallium atoms in the second sub-active layer.

In the display panel provided in the embodiment of the present disclosure, a material of the first sub-active layer comprises indium gallium zinc oxide, wherein a ratio of a number of indium atoms, a number of gallium atoms, and a number of zinc atoms in the first sub-active layer is indium:gallium:zinc=M:1:N, wherein $0<M<1$, $0<N<1$, and a ratio of a number of indium atoms, a number of gallium atoms, and a number of zinc atoms in the third sub-active layer is indium:gallium:zinc=X:1:Y, $0<X<1$, $0<Y<1$.

In the display panel provided in the embodiment of the present disclosure, the first sub-active layer comprises a nitrogen-doped indium gallium zinc oxide active layer, and the third sub-active layer comprises a nitrogen-doped indium gallium zinc oxide active layer.

In the display panel provided in the embodiment of the present disclosure, a material of the second sub-active layer comprises indium gallium zinc oxide, and a ratio of a number of indium atoms, a number of gallium atoms, and a number of zinc atoms in the second sub-active layer is indium:gallium:zinc=1:1:1.

In the display panel provided in the embodiment of the present disclosure, the first gate is disposed on the substrate, the first gate insulating layer covers the first gate, the active layer is disposed on a side of the first gate insulating layer away from the substrate, and the interlayer dielectric layer covers the active layer and the first gate insulating layer.

In the display panel provided in the embodiment of the present disclosure, the first gate is disposed on the substrate, the first gate insulating layer covers the first gate, the active layer is disposed on a side of the first gate insulating layer away from the substrate, and the interlayer dielectric layer covers the active layer and the first gate insulating layer.

In the display panel provided in the embodiment of the present disclosure, the display panel further comprises:
  a second gate insulating layer disposed on a side of the active layer away from the first gate insulating layer;
  a second gate disposed on a side of the second gate insulating layer away from the active layer;
  a third via penetrating the interlayer dielectric layer;
  a fourth via penetrating the interlayer dielectric layer and the first gate insulating layer; and
  a connection electrode disposed in the third via and the fourth via for connecting the first gate and the second gate.

In the display panel provided in the embodiment of the present disclosure, the active layer is disposed on the substrate, the first gate insulating layer covers the substrate and the active layer, the first gate is disposed on a side of the first gate insulating layer away from the substrate, and the interlayer dielectric layer covers the first gate and the first gate insulating layer.

In the display panel provided in the embodiment of the present disclosure, the active layer is disposed on the substrate, the first gate insulating layer covers the substrate and the active layer, the first gate is disposed on a side of the first gate insulating layer away from the substrate, and the interlayer dielectric layer covers the first gate and the first gate insulating layer.

In the display panel provided in the embodiment of the present disclosure, a thickness of the first sub-active layer and a thickness of the third sub-active layer are less than or equal to 15 nm, and a thickness of the second sub-active layer ranges from 10 nm to 90 nm.

In the display panel provided in the embodiment of the present disclosure, the number of gallium atoms in the third sub-active layer is equal to the number of gallium atoms in the first sub-active layer.

In the display panel provided in the embodiment of the present disclosure, the display panel further comprises:
  a passivation layer disposed on the interlayer dielectric layer;
  a contact electrode disposed on the passivation layer, wherein one end of the contact electrode is connected to the drain;
  a planarization layer disposed on the passivation layer;
  an anode disposed on the planarization layer, wherein another end of the contact electrode is connected to the anode;
  a pixel definition layer disposed on the planarization layer and covering the anode;
  a light-emitting layer disposed within an opening of the pixel definition layer; and
  a cathode disposed on the light-emitting layer.

An embodiment of the present disclosure further provides a manufacturing method of a display panel, wherein the manufacturing method comprises steps of:
  providing a substrate;
  forming a first gate on the substrate;
  forming a first gate insulating layer on the substrate;
  forming an active layer on the substrate, wherein the active layer and the first gate are disposed in different layers, the active layer comprises at least a first sub-active layer and a second sub-active layer stacked, the second sub-active layer is disposed on a side of the first sub-active layer away from the substrate, and a number of gallium atoms in the first sub-active layer is greater than a number of gallium atoms in the second sub-active layer;
  forming an interlayer dielectric layer on the substrate;
  forming a first via and a second via on the interlayer dielectric layer;
  forming a source and a drain on the substrate, wherein the source is electrically connected to the active layer through the first via, and the drain is electrically connected to the active layer through the second via; wherein
  the step of forming the active layer on the substrate comprises:
  forming indium gallium zinc oxide on the substrate and nitrogen doping the indium gallium zinc oxide to form the first sub-active layer; and
  forming indium gallium zinc oxide on the first sub-active layer to form the second sub-active layer.

In the manufacturing method of the display panel provided in the embodiment of the present disclosure, after the step of forming indium gallium zinc oxide on the first sub-active layer to form the second sub-active layer, the method further comprises:
  forming oxide materials on the second sub-active layer and nitrogen doping the oxide materials to form the third sub-active layer.

In the manufacturing method of the display panel provided in the embodiment of the present disclosure, after the step of forming the active layer on the substrate, the method further comprises:
  forming a second gate insulating layer on the active layer; and
  forming a second gate on the second gate insulating layer.

In the manufacturing method of the display panel provided in the embodiment of the present disclosure, the step of forming the first via and the second via on the interlayer dielectric layer further comprises:
  forming a third via and a fourth via on the interlayer dielectric layer.

In the manufacturing method of the display panel provided in the embodiment of the present disclosure, the step of forming the source and the drain on the substrate further comprises forming a connection electrode on the substrate, the connection electrode is disposed in the third via and the fourth via for connecting the first gate and the second gate.

An embodiment of the present disclosure further provides a manufacturing method of a display panel, the manufacturing method comprises steps of:
  providing a substrate;
  forming an active layer on the substrate, wherein the active layer and the first gate are disposed in different layers, the active layer comprises at least a first sub-active layer and a second sub-active layer stacked, the second sub-active layer is disposed on a side of the first sub-active layer away from the substrate, and a number of gallium atoms in the first sub-active layer is greater than a number of gallium atoms in the second sub-active layer;
  forming a first gate insulating layer on the active layer;
  forming a first gate on the first gate insulating layer;
  forming an interlayer dielectric layer on the first gate;
  forming a first via and a second via on the interlayer dielectric layer;
  forming a source and a drain on the substrate, wherein the source is electrically connected to the active layer through the first via, and the drain is electrically connected to the active layer through the second via; wherein
  the step of forming the active layer on the substrate comprises:
  forming indium gallium zinc oxide on the substrate and nitrogen doping the indium gallium zinc oxide to form the first sub-active layer; and
  forming indium gallium zinc oxide on the first sub-active layer to form the second sub-active layer.

In the manufacturing method of the display panel provided in the embodiment of the present disclosure, after the step of forming indium gallium zinc oxide on the first sub-active layer to form the second sub-active layer, the method further comprises:
  forming oxide materials on the second sub-active layer and nitrogen doping the oxide materials to form a third sub-active layer.

In order to make the above-mentioned content of the present disclosure more obvious and understandable, preferred embodiments are specifically described below in conjunction with the accompanying drawings, which are described in detail as follows.

Embodiments of the present disclosure provides a display panel and a manufacturing method thereof. In the display panel provided in the embodiments of the present disclosure, the active layer is defined as a structure of at least two layers, i.e., the first sub-active layer and the second sub-active layer, wherein, the number of gallium atoms in the first sub-active layer is greater than the number of gallium atoms in the second sub-active layer. Due to the strong binding ability of gallium to oxygen atoms, an occurrence of deep energy level defects can be effectively suppressed, thereby improving stability of a device.

DESCRIPTION OF SPECIFIC EMBODIMENTS OF THE INVENTION

In order to make purposes, technical solutions and advantages of the present disclosure clearer, the present disclosure will be described in further detail below with reference to the drawings. Please refer to reference numerals in the drawings, in which same component symbols represent same components. The following description is based on specific embodiments of the present disclosure shown, which should not be construed as limiting other specific embodiments that are not described in detail herein. A term "embodiment" used in this specification means an example, a case, or illustration.

In the description of the present disclosure, it should be understood that orientations or position relationships indicated by terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that devices or elements referred to herein are required to have specific orientations or be constructed or operate in the specific orientations. Accordingly, the terms should not be construed as limiting the present disclosure. In addition, terms "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the description of the present disclosure, it should be noted that unless otherwise clearly defined and limited, terms "mounted", "connected/coupled", and "connection" should be interpreted broadly. For example, the terms may refer to a fixed connection, a detachable connection, or an integral connection; the terms may also refer to a mechanical connection, an electrical connection; the terms may further refer to a direct connection, an indirect connection through an intermediary, or an interconnection between two elements. Those skilled in the art can understand the specific meanings of the above-mentioned terms in the present disclosure according to circumstances.

Embodiments of the present disclosure provide a display panel and a manufacturing method thereof. Detailed description will be given below. It should be noted that an order of description of the following embodiments is not a limitation on a preferred order of the embodiments.

An embodiment of the present disclosure provides a display panel comprising a substrate, a first gate, a first gate insulating layer, an active layer, an interlayer dielectric layer, a first via, a second via, a source, and a drain. The first gate is disposed on the substrate. The first gate insulating layer is disposed on the substrate. The active layer is disposed on the substrate and disposed in a different layer from the first gate. The active layer comprises at least a first sub-active layer and a second sub-active layer stacked, the first sub-active layer is disposed on the substrate, the second sub-active layer is disposed on a side of the first sub-active layer away from the substrate, and a number of gallium atoms in the first sub-active layer is greater than a number of gallium atoms in the second sub-active layer. The interlayer dielectric layer is disposed on the substrate. The first via penetrates at least the interlayer dielectric layer. The second via penetrates at least the interlayer dielectric layer. The source is disposed on the interlayer dielectric layer and electrically connected to the active layer through the first via. The drain is disposed on the interlayer dielectric layer and electrically connected to the active layer through the second via.

In the display panel provided in the embodiment of the present disclosure, the active layer is defined in a structure of at least two layers, i.e., the first sub-active layer and the second sub-active layer, wherein the number of gallium atoms in the first sub-active layer is greater than the number of gallium atoms in the second sub-active layer. Strong binding ability of gallium to oxygen atoms effectively suppresses an occurrence of deep energy level defects, thereby improving stability of a device.

The display panel provided in the present disclosure will be described in detail below through specific embodiments.

Figure 1:
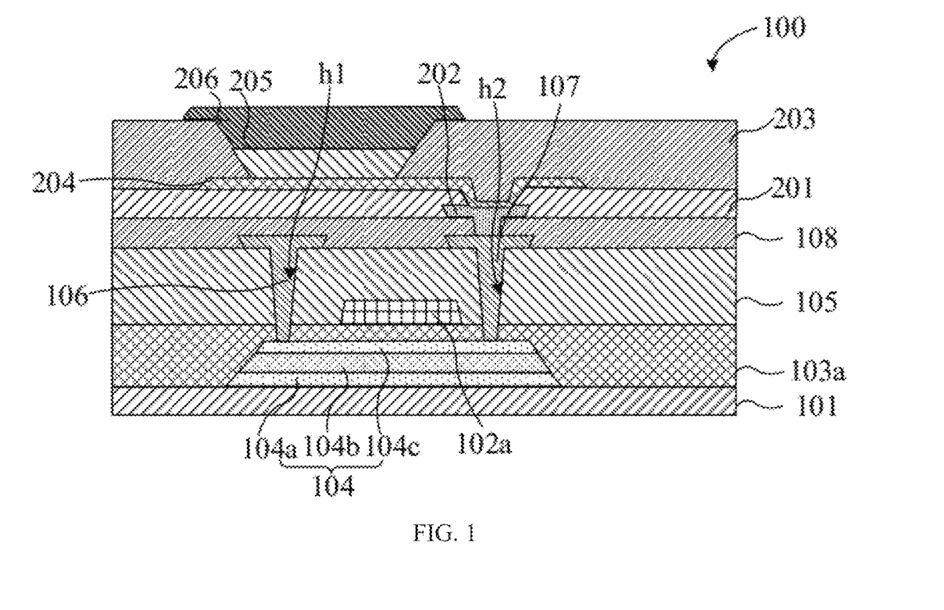
FIG. 1 is a schematic structural diagram of a display panel according to a first embodiment of the present disclosure.

Please refer to FIG. 1, FIG. 1 is a schematic structural diagram of a display panel according to a first embodiment of the present disclosure. The embodiment of the present disclosure provides a display panel 100 comprising a substrate 101, a first gate 102a, an active layer 104, a source 106 and a drain 107, a first gate insulating layer 103a, an interlayer dielectric layer 105, a passivation layer 108, a contact electrode 202, a planarization layer 201, a pixel definition layer 203, an anode 204, a light-emitting layer 205, and a cathode 206. Specifically, the active layer 104 is disposed on the substrate 101. The first gate insulating layer 103a covers the substrate 101 and the active layer 104. The active layer 104 comprises at least a first sub-active layer 104a disposed on the substrate 101 and a second sub-active layer 104b disposed on a side of the first sub-active layer 104a away from the substrate 101 stacked, wherein a number of gallium atoms in the first sub-active layer 104a is greater than a number of gallium atoms in the second sub-active layer 104b. The first gate 102a is disposed on a side of the first gate insulating layer 103a away from the substrate 101. The interlayer dielectric layer 105 covers the first gate 102a and the first gate insulating layer 103a. A first via h1 and a second via h2 penetrate the interlayer dielectric layer 105 and the first gate insulating layer 103a, the source 106 is electrically connected to the active layer 104 through the first via h1, and the drain 107 is electrically connected to the active layer 104 through the second via h2. The passivation layer 108 is disposed on the interlayer dielectric layer 105 and covers the source 106 and the drain 107. The contact electrode 202 is disposed on the passivation layer 108, and one end of the contact electrode 202 is connected to the drain 107. The planarization layer 201 is disposed on the passivation layer 108. The anode 204 is disposed on the planarization layer 201, and another end of the contact electrode 202 is connected to the anode 204. The pixel definition layer 203 is disposed on the planarization layer 201 and covers the anode 204. The light-emitting layer 205 is disposed within an opening of the pixel definition layer 203. The cathode 206 is disposed on the light-emitting layer 205.

In the display panel 100 provided in the embodiment of the present disclosure, the active layer 104 is defined in a structure of at least two layers, i.e., the first sub-active layer 104a and the second sub-active layer 104b, wherein the number of gallium atoms in the first sub-active layer 104a is greater than the number of gallium atoms in the second sub-active layer 104b. Since gallium has strong bonding ability with oxygen atoms, an occurrence of deep energy level defects at an interface between the first gate insulating layer 103a and the active layer 104 can be effectively suppressed, thereby improving stability of a device.

In addition, the active layer 104 may further comprise a third sub-active layer 104c. The third sub-active layer 104c is disposed on the second sub-active layer 104b. A number of gallium atoms in the third sub-active layer 104c is greater than the number of gallium atoms in the second sub-active layer 104b.

It should be noted that in the embodiment of the present disclosure, the number of gallium atoms in the first sub-active layer 104a may be greater than the number of gallium atoms in the third sub-active layer 104a. In another embodiment, the number of gallium atoms in the first sub-active layer 104a may be less than or equal to the number of gallium atoms in the third sub-active layer 104a.

In the display panel 100 provided in the embodiment of the present disclosure, the active layer 104 is defined in a three-layer stacked structure, that is, the first sub-active layer 104a, the second sub-active layer 104b, and the third sub-active layer 104c, wherein the number of gallium atoms in the first sub-active layer 104a and the third sub-active layer 104c is greater than the number of gallium atoms in the second sub-active layer 104b. Due to the strong binding ability of gallium to oxygen atoms, an occurrence of deep energy level defects at an interface between the substrate 101 and the active layer 104 and an interface between the active layer 104 and the interlayer dielectric layer 105 can be effectively suppressed, thereby improving the stability of the device.

Figure 2:
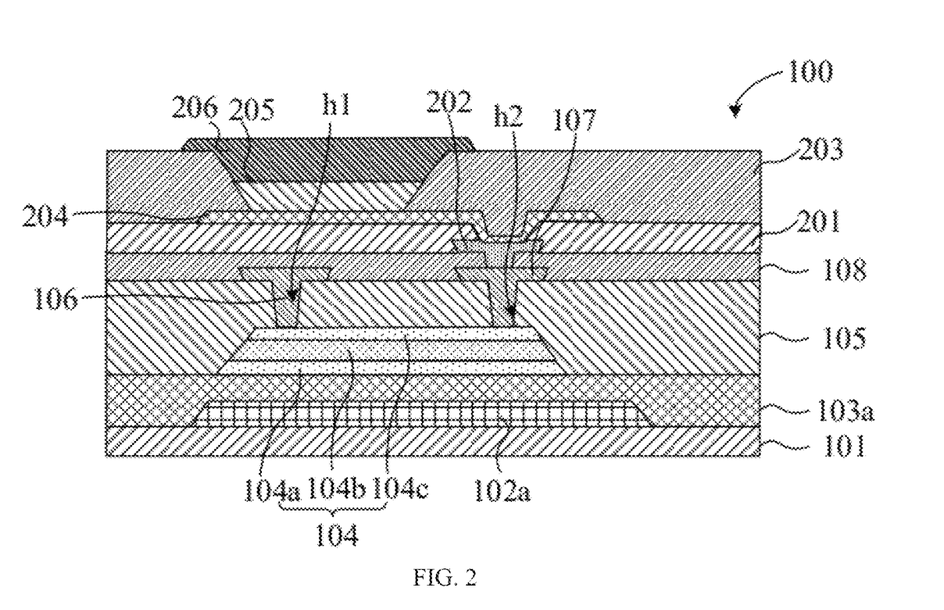
FIG. 2 is a schematic structural diagram of a display panel according to a second embodiment of the present disclosure.

Please refer to FIG. 2, FIG. 2 is a schematic structural diagram of a display panel according to a second embodiment of the present disclosure. A display panel 100 provided in the second embodiment of the present disclosure differs from the display panel 100 provided in the first embodiment in that a first gate 102a is disposed on a substrate 101. A first gate insulating layer 103a covers the first gate 102a. An active layer 104 is disposed on a side of the first gate insulating layer 103a away from the substrate 101. An interlayer dielectric layer 105 covers the active layer 104 and the first gate insulating layer 103a.

In the display panel 100 provided in the embodiment of the present disclosure, the active layer 104 is defined in a three-layer stacked structure, that is, a first sub-active layer 104a, a second sub-active layer 104b, and a third sub-active layer 104c, wherein a number of gallium atoms in the first sub-active layer 104a and the third sub-active layer 104c is greater than a number of gallium atoms in the second sub-active layer 104b. Since gallium has strong bonding ability with oxygen atoms, an occurrence of deep energy level defects at an interface between the first gate insulating layer and the active layer 104 and an interface between the active layer 104 and the interlayer dielectric layer 105 can be effectively suppressed, thereby improving stability of a device.

Figure 3:
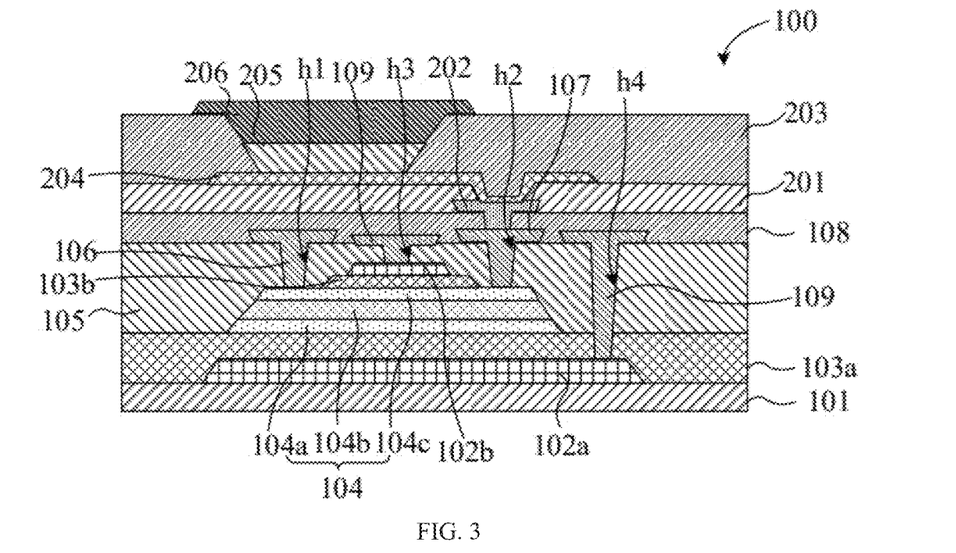
FIG. 3 is a schematic structural diagram of a display panel according to a third embodiment of the present disclosure.
Figure 4:
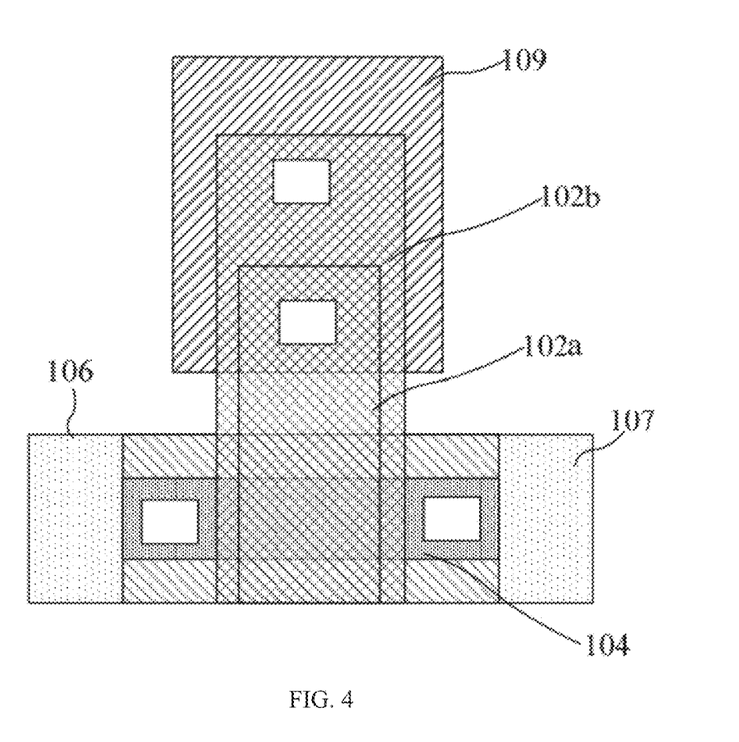
FIG. 4 is a schematic plan structural diagram of the display panel according to the third embodiment of the present disclosure.

Please refer to FIGS. 3 and 4, FIG. 3 is a schematic structural diagram of a display panel according to a third embodiment of the present disclosure. FIG. 4 is a schematic plan structural diagram of the display panel according to the third embodiment of the present disclosure. A display panel 100 provided in the third embodiment of the present disclosure differs from the display panel 100 provided in the second embodiment in that the display panel 100 may further comprises a second gate insulating layer 103b, a second gate 102b, a third via h3, a fourth via h4, and a connection electrode 109. The second gate insulating layer 103b is disposed on a side of the active layer 104 away from the first gate insulating layer 103a. The second gate 102b is disposed on a side of the second gate insulating layer 103b away from the active layer 104. The third via h3 penetrates the interlayer dielectric layer 105. The fourth via h4 penetrates the interlayer dielectric layer 105 and the first gate insulating layer 103a. The connection electrode 109 is disposed in the third via h3 and the fourth via h4 for connecting the first gate 102a and the second gate 102b.

In the embodiment of the present disclosure, a structure of the display panel 100 is designed as a dual-gate structure, that is, the display panel 100 comprises the first gate 102a and the second gate 102b, and the first gate 102a and the second gate 102b are connected through the connection electrode 109, and mobility of the display panel 100 is improved through the dual-gate structure. In addition, the active layer 104 is defined in a three-layer stacked structure, that is, a first sub-active layer 104a, a second sub-active layer 104b, and a third sub-active layer 104c, wherein a number of gallium atoms in the first sub-active layer 104a and the third sub-active layer 104c is greater than a number of gallium atoms in the second sub-active layer 104b. Since gallium has strong bonding ability with oxygen atoms, an occurrence of deep energy level defects at an interface between the first gate insulating layer and the active layer 104 and an interface between the active layer 104 and the second gate insulating layer 103b can be effectively suppressed, thereby improving stability of a device.

In some embodiments, the substrate 101 may be a glass substrate or a flexible substrate. The substrate 101 may further comprise a first flexible substrate layer, a silicon dioxide layer, a second flexible substrate layer, and a buffer layer stacked in sequence. Wherein materials of the second flexible substrate layer and the first flexible substrate layer are same and may include at least one of polyimide (PI), polyethylene terephthalate (PET), polyethylene naphthalate (PEN), polycarbonate (PC), polyethersulfone (PES), aromatic fluorotoluene containing polyaromatic esters (PAR), or polycyclic olefin (PCO). The buffer layer is composed of a stack structure of one or more than two of silicon-containing nitrides, silicon-containing oxides, or silicon-containing nitrogen oxides. Materials of the first gate 102a may be selected from metals such as Cr, W, Ti, Ta, Mo, Al, and Cu, or alloys, and gate metal layers composed of a plurality of layers of metal may also meet needs.

Materials of the first gate insulating layer 103a may be one or any combination of silicon nitride, silicon oxide, silicon oxynitride, or aluminum oxide.

In some embodiments, a material of the first sub-active layer 104a comprises indium gallium zinc oxide, wherein a ratio of a number of indium atoms, a number of gallium atoms, and a number of zinc atoms in the first sub-active layer 104a is indium:gallium:zinc=M:1:N, wherein 0<M<1, 0<N<1. For example, in one embodiment, the ratio of the number of indium atoms, the number of gallium atoms, and the number of zinc atoms in the first sub-active layer 104a is any one of indium:gallium:zinc=0.1:1:0.2, indium:gallium:zinc=0.4:1:0.2, indium:gallium:zinc=0.3:1:0.3, or indium:gallium:zinc=0.1:1:0.8.

A material of the third sub-active layer 104c comprises indium gallium zinc oxide, and a ratio of a number of indium atoms, a number of gallium atoms, and a number of zinc atoms in the third sub-active layer 104c is indium:gallium:zinc=X:1:Y, (<X<1, 0<Y<1. For example, in one embodiment, the ratio of the number of indium atoms, the number of gallium atoms, and the number of zinc atoms in the third sub-active layer 104c is any one of indium:gallium:zinc=0.3:1:0.2, indium:gallium:zinc=0.4:1:0.2, indium:gallium:zinc=0.3:1:0.3, or indium:gallium:zinc=0.6:1:0.8.

It should be noted that the number of gallium atoms in the first sub-active layer 104a and in the third sub-active layer 104c may be same or different.

A material of the second sub-active layer comprises indium gallium zinc oxide, wherein a ratio of a number of indium atoms, a number of gallium atoms, and a number of zinc atoms in the second sub-active layer 104b is indium:gallium:zinc=1:1:1.

Since oxygen bonding tendency (or "bonding energy") of indium, gallium, and zinc are different from each other, there are some oxygen vacancies in which some of indium, gallium, and zinc are not bonded to oxygen. The oxygen vacancy may appear in an energy level as a "deep energy level" formed near a valence band. An energy difference $\Delta EDC$ between the deep energy level and a conduction band is about 2.4 eV. The deep energy level of indium gallium zinc oxide (IGZO) has a slightly higher energy level than the valence band. Therefore, electrons at the valence band energy level can easily transition to the deep energy level. Then, with lower energy, the electrons can transition to the conduction band. As a result, carrier mobility of IGZO is very high.

However, when a thin film transistor including IGZO of a channel element is used for a long time or exposed to very strong light, mobility characteristic of IGZO may deteriorate. Note that one of main reasons is that oxygen vacancies (or defect states) causing the "deep energy level" will increase and then electrons that transition from the valence band to the "deep energy level" may be trapped in the "deep energy level", so these trapped electrons may hinder the transition of the conduction band. In other words, if a number of defects forming the "deep energy level" is too large, electrons transitioned from the valence band cannot transition to the conduction band, but remain in the "deep energy level". This is called a "deep energy level trap". A large amount of oxygen vacancies may cause a large number of defects at the interface between the first gate insulating layer 103a and the active layer 104 and the interface between the active layer 104 and the second gate insulating layer 103b, resulting in poor stability and low mobility of the display panel.

Therefore, in this embodiment, the active layer 104 is defined as three layers, i.e., the first sub-active layer 104a, the second sub-active layer 104b, and the third sub-active layer 104c, wherein the number of gallium atoms in the first sub-active layer 104a and the third sub-active layer 104c is greater than the number of gallium atoms in the second sub-active layer 104b. Since gallium has strong bonding ability with oxygen atoms, the occurrence of deep energy level defects can be effectively suppressed, thereby improving the stability of the device and reliability of the display panel. The ratio of the number of indium atoms, the number of gallium atoms, and the number of zinc atoms in the second sub-active layer 104b is indium:gallium:zinc=1:1:1, thereby ensuring conductivity and the mobility of the display panel.

In some embodiments, the first sub-active layer 104a comprises a nitrogen-doped indium gallium zinc oxide active layer, and the third sub-active layer 104c comprises a nitrogen-doped indium gallium zinc oxide active layer. Due to strong binding ability of nitrogen atoms to oxygen vacancies, the introduction of nitrogen elements can occupy oxygen vacancies, effectively regulating carrier concentration and defect concentration in the active layer, thereby improving the mobility of the display panel and improving the reliability of the display panel.

In some embodiments, at least one of phosphorus, fluorine, selenium, or tellurium may further be doped into the first sub-active layer 104a and/or the third sub-active layer 104c.

In some embodiments, a thickness of the first sub-active layer 104a and a thickness of the third sub-active layer 104c are less than or equal to 15 nm, and a thickness of the second sub-active layer 104b ranges from 10 nm to 90 nm. Alternatively, the thickness of the first sub-active layer 104a may be any one of 0.5 nm, 3 nm, 5 nm, 8 nm, or 12 nm. The thickness of the third sub-active layer 104c may be any one of 3 nm, 5 nm, 8 nm, or 12 nm. The thickness of the second sub-active layer 104b may be any one of 15 nm, 23 nm, 35 nm, 58 nm, or 70 nm. In the embodiment of the present disclosure, since the ratio of the number of indium atoms, the number of gallium atoms, and the number of zinc atoms in the second sub-active layer 104b is indium:gallium:zinc=1:1:1, the second sub-active layer 104b has the best conductivity, and the thicknesses of the first sub-active layer 104a and the thickness of the third sub-active layer 104c are both less than the thickness of the second sub-active layer 104b, that is, the conductivity of the active layer is ensured, and the stability of the display panel can be improved.

The interlayer dielectric layer 105 may be selected from oxides or oxynitride compounds.

The source 106 and the drain 107 may be selected from metals such as Cr, W, Ti, Ta, Mo, Al, and Cu, or alloys, and gate metal layers made of a plurality of layers of metal may also meet needs.

Materials of the second gate insulating layer 103b may be selected from one or any combination of silicon nitride, silicon oxide, silicon oxynitride, or aluminum oxide.

Materials of the second gate 102b may be selected from metals such as Cr, W, Ti, Ta, Mo, Al, and Cu, or alloys, and gate metal layers composed of a plurality of layers of metal may also meet needs.

The connection electrode 109 may be selected from metals such as Cr, W, Ti, Ta, Mo, Al, and Cu, or alloys, and gate metal layers composed of a plurality of layers of metal may also meet needs. In some embodiments, the connection electrode 109 may be made of same materials as the first gate 102a and the second gate 102b.

Materials of the passivation layer 108 may be inorganic non-metallic film layer materials of a stacked layer of SiOx, SiOx/SiNx, or a stacked layer of SiOx/SiNx/Al2O3.

Figure 5:
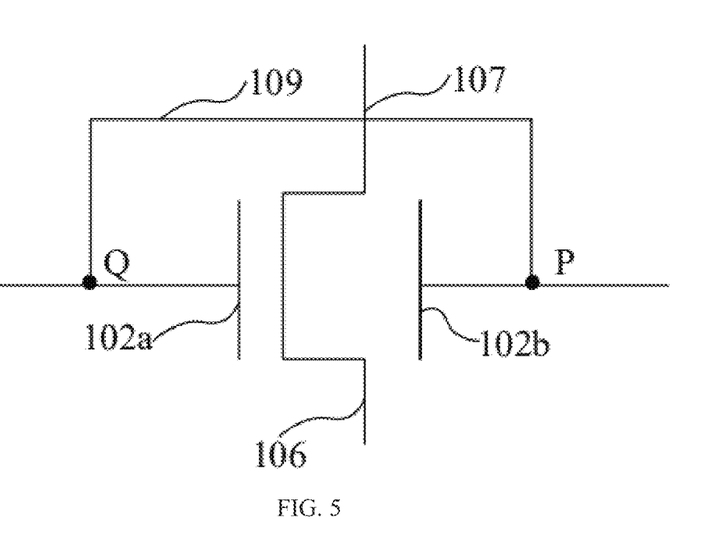
FIG. 5 is a circuit diagram corresponding to a thin film transistor of the display panel according to the third embodiment of the present disclosure.

Please refer to FIG. 5, FIG. 5 is a circuit diagram corresponding to a display panel according to an embodiment of the present disclosure. The first gate 102a is connected to a first node Q, the second gate 102b is connected to a second node P, and the first gate 102a and the second gate 102b are electrically connected through the connection electrode 109. In the embodiment of the present disclosure, a bottom gate implementing a dual-gate thin film transistor is used as a main gate, so that a voltage of a top gate source is used to adjust a threshold voltage of a driving transistor to complete extraction and compensation of the threshold voltage, thereby reducing complexity of a pixel circuit and achieving better display uniformity. Since the dual-gate transistor has better stability, and under action of long-term electrical stress, a change of the threshold voltage is smaller than that of a single-gate transistor, after completing one threshold voltage extraction, the threshold voltage can be extracted for a next time after a long period of time, which undoubtedly makes a timing of the pixel circuit simpler and a driving speed faster.

Figure 6:
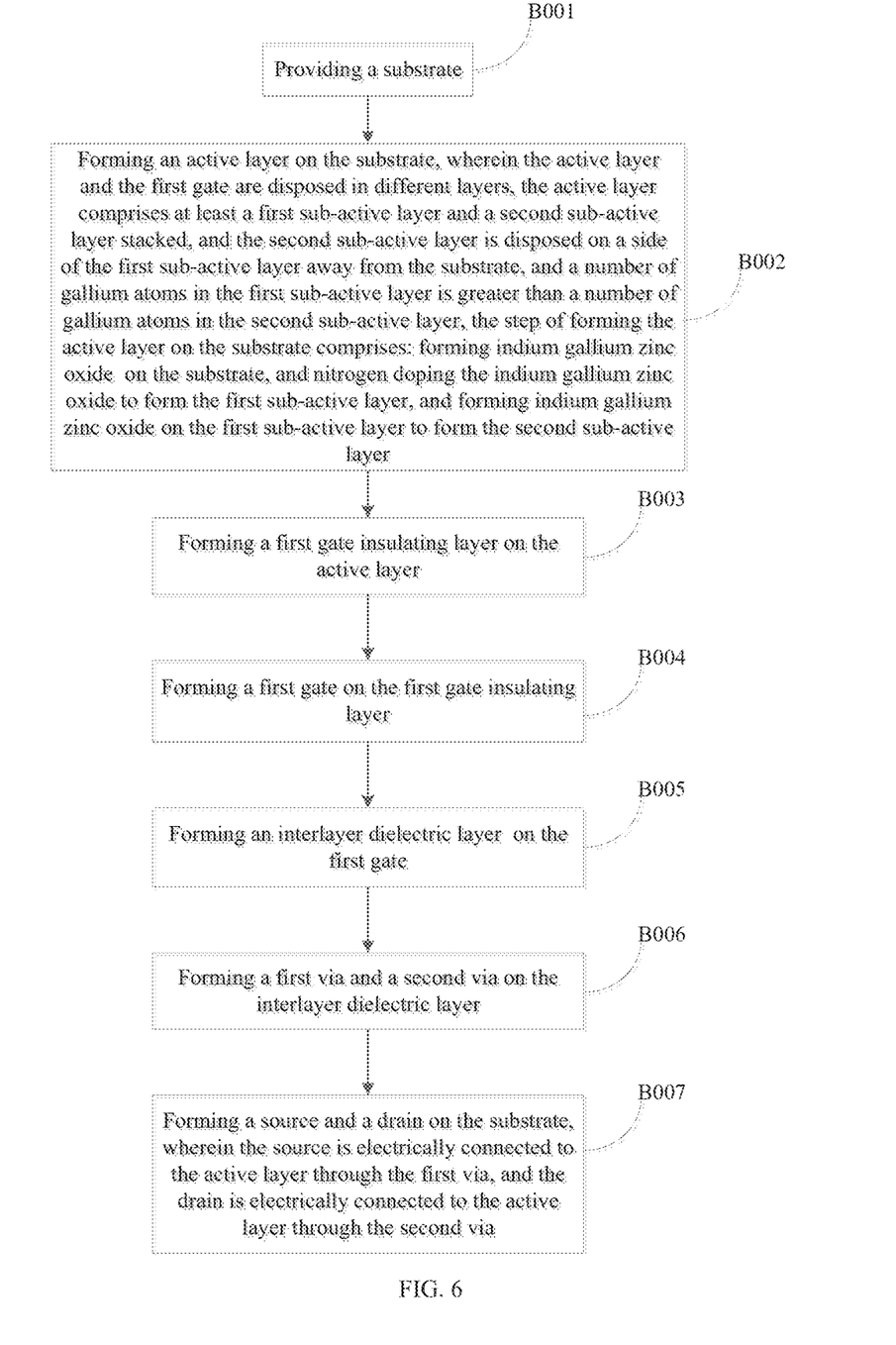
FIG. 6 is a flowchart of steps of a manufacturing method of the display panel according to the first embodiment of the present disclosure.

Please refer to FIGS. 1 and 6, FIG. 6 is a flowchart of steps of a manufacturing method of the display panel according to the first embodiment of the present disclosure. The manufacturing method of the display panel comprises following steps:

Step B001, providing a substrate 101.

Specifically, the substrate 101 may be a glass substrate or a flexible substrate. In some embodiments, the substrate 101 may further comprise a first flexible substrate layer, a silicon dioxide layer, a second flexible substrate layer, and a buffer layer that are sequentially stacked. Materials of the second flexible substrate layer and the first flexible substrate layer are same and may comprise at least one of polyimide (PI), polyethylene terephthalate (PET), polyethylene naphthalate (PEN), polycarbonate (PC), polyethersulfone (PES), aromatic fluorotoluene containing polyaromatic esters (PAR), or polycyclic olefin (PCO). The buffer layer is composed of a stack structure of one or more than two of silicon-containing nitrides, silicon-containing oxides, or silicon-containing nitrogen oxides.

Step B002, forming an active layer 104 on the substrate 101, wherein the active layer 104 and the first gate 102a are disposed in different layers. The active layer 104 comprises at least a first sub-active layer 104a and a second sub-active layer 104b stacked, and the second sub-active layer 104b is disposed on a side of the first sub-active layer 104a away from the substrate 101, and a number of gallium atoms in the first sub-active layer 104a is greater than a number of gallium atoms in the second sub-active layer 104b. The step of forming the active layer 104 on the substrate 101 comprises:

Iridium gallium zinc oxide is formed on the substrate 101, and the indium gallium zinc oxide is nitrogen doped to form the first sub-active layer 104a.

Specifically, the first sub-active layer 104a is formed on the substrate 101 by methods such as magnetron sputtering, reactive sputtering, atomic layer deposition, or spin coating.

Next, indium gallium zinc oxide is formed on the first sub-active layer 104a to form the second sub-active layer 104b.

Specifically, the second sub-active layer 104b is formed on the first sub-active layer 104a by methods such as magnetron sputtering, reactive sputtering, atomic layer deposition, or spin coating.

Alternatively, the step B002 may further comprise forming oxide materials on the second sub-active layer 104b by methods such as magnetron sputtering, reactive sputtering, atomic layer deposition, or spin coating, and nitrogen doping the oxide materials to form a third sub-active layer 104c.

Step B003, forming a first gate insulating layer 103a on the active layer 104.

Materials of the first gate insulating layer 103a may be selected from one or multiple combinations of silicon oxide, silicon nitride, a high dielectric constant dielectric material (such as aluminum oxide, hafnium oxide, zirconium oxide, etc.), and organic dielectric materials, and a thickness of the first gate insulating layer 103a may be 500 nm-1000 nm, in particular 600 nm. The first gate insulating layer 103a may be formed using plasma chemical vapor deposition, magnetron sputtering or reactive sputtering, atomic layer deposition, or spin coating.

Step B004, forming a first gate 102a on the first gate insulating layer 103a.

The first gate 102a may be formed of a single metal layer or multiple metal layers using a simple substance or an alloy of molybdenum (Mo), copper (Cu), aluminum (Al), titanium (Ti), and chromium (Cr). The first gate 102a may also use non-reflective materials, such as one or multiple combinations of conductive metal oxides (e.g., ITO) or other conductive materials. A thickness of the first gate 102a may be 10 nm-800 nm, in particular 200 nm, as desired.

Step B005, forming an interlayer dielectric layer 105 on the first gate 102a.

The interlayer dielectric layer 105 is deposited on the substrate 101 by plasma chemical vapor deposition. Materials of the interlayer dielectric layer 105 may be one or multiple combinations of silicon oxide, silicon nitride, a high dielectric constant dielectric material (such as aluminum oxide, hafnium oxide, and zirconium oxide, etc.), and organic dielectric materials, and a thickness of the interlayer dielectric layer 105 may be 100 nm-1200 nm, in particular 400 nm.

Step B006, forming a first via h1 and a second via h2 on the interlayer dielectric layer 105.

The first via h1, the second via h2, a third via h3, and a fourth via h4 are formed by a yellow light process. Specifically, the first via h1 may be a source contact hole, and the second via h2 may be a drain contact hole.

Step B007, forming a source 106 and a drain 107 on the substrate 101, wherein the source 106 is electrically connected to the active layer 104 through the first via h1, and the drain 107 is electrically connected to the active layer 104 through the second via h2.

Specifically, an electrode conductive layer is deposited on the interlayer dielectric layer 105 and on the first via h1 and the second via h2 by magnetron sputtering, reactive sputtering, thermal evaporation, or electron evaporation. Materials of the electrode conductive layer may be one or multiple combinations of metals (such as molybdenum, copper, aluminum, titanium, and chromium), conductive metal oxides (such as ITO), or other conductive materials. Then, the source 106 and the drain 107 are formed by etching.

Figure 7:
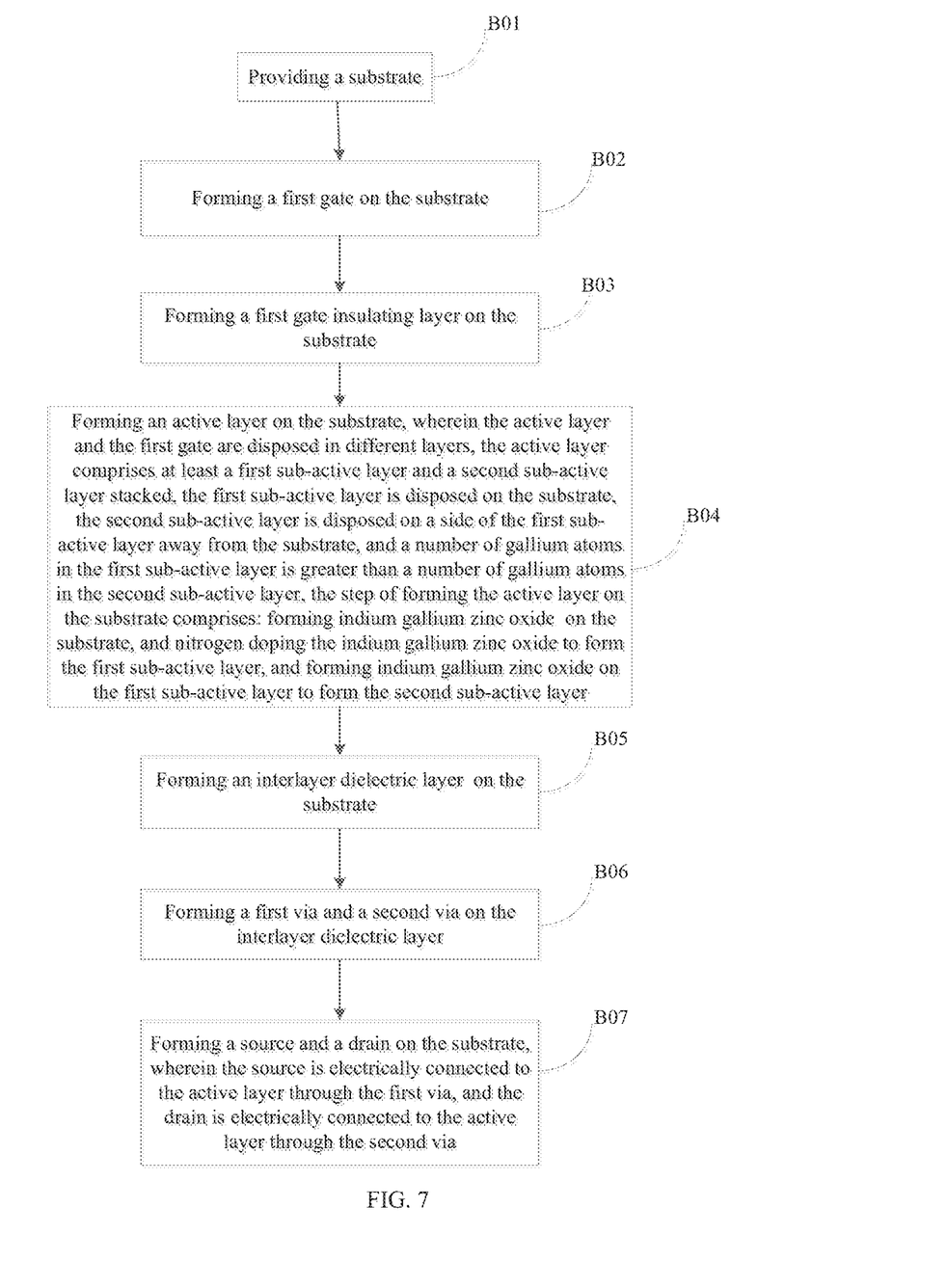
FIG. 7 is a flowchart of steps of a manufacturing method of the display panel according to the third embodiment of the present disclosure.
Figure 8:
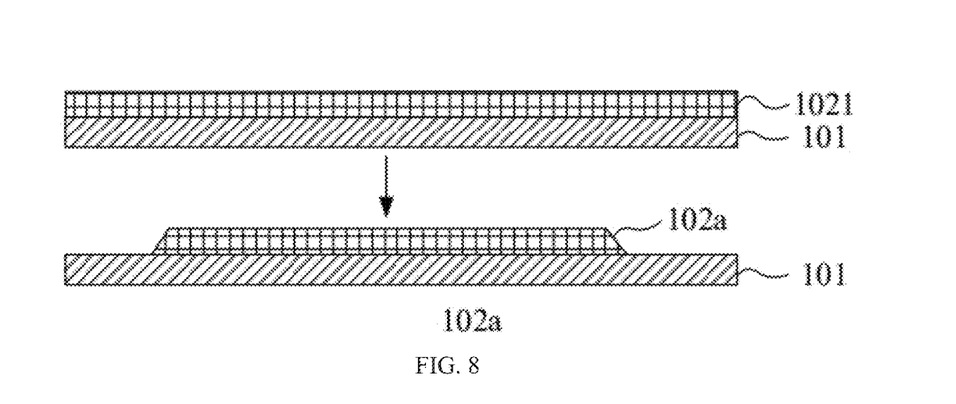
FIGS. 8, 9, 10, 11, 12 and 13 are schematic diagrams of a manufacturing method of a display panel according to an embodiment of the present disclosure.

Please refer to FIG. 7, FIG. 7 is a flowchart of a manufacturing method the display panel according to the third embodiment of the present disclosure. The manufacturing method of the display panel comprises following steps:

Step B01, providing a substrate 101, please refer to FIG. 8.

The substrate 101 may be a glass substrate or a flexible substrate. In some embodiments, the substrate 101 may further comprise a first flexible substrate layer, a silicon dioxide layer, a second flexible substrate layer, and a buffer layer that are sequentially stacked. Materials of the second flexible substrate layer and the first flexible substrate layer are same and may comprise at least one of polyimide (PI), polyethylene terephthalate (PET), polyethylene naphthalate (PEN), polycarbonate (PC), polyethersulfone (PES), aromatic fluorotoluene containing polyaromatic esters (PAR), or polycyclic olefin (PCO). The buffer layer is composed of a stack structure of one or more than two of silicon-containing nitrides, silicon-containing oxides, or silicon-containing nitrogen oxides.

Step B02, forming the first gate 102a on the substrate 101, please continue to refer to FIG. 8.

Specifically, a first gate conductive layer 1021 is first deposited on the substrate 101. The first gate conductive layer 1021 may be formed of a single metal layer or a multilayer metal layer using a simple substance or an alloy of molybdenum (Mo), copper (Cu), aluminum (Al), titanium (Ti), or chromium (Cr). The first gate conductive layer 1021 may also adopt non-reflective materials, such as one or multiple combinations of conductive metal oxides (such as ITO) or other conductive materials. A thickness of the first gate conductive layer 1021 may be 10 nm-800 nm, in particular 200 nm, as desired. The first gate conductive layer 1021 may be formed on the substrate 101 using techniques such as magnetron sputtering, reactive sputtering, thermal evaporation, and electron evaporation. Reflective here refers to a transmittance of at least less than 20%. The first gate conductive layer 1021 may then be patterned to form the first gate 102a. Specifically, a photoresist is spin-coated on the first gate conductive layer 1021, followed by operations of photolithography, degumming, cleaning, and the like to obtain a patterned first gate 102a.

Figure 9:
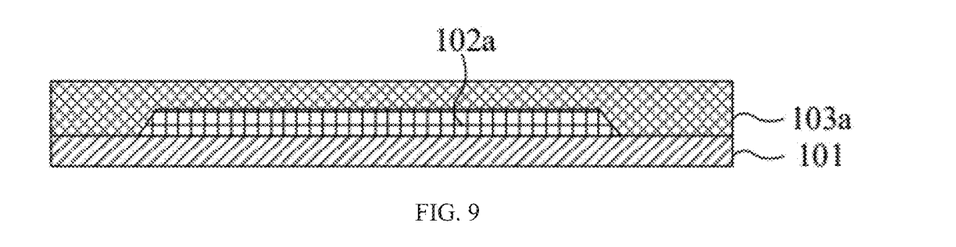

Step B03, forming a first gate insulating layer 103a on the substrate 101, please refer to FIG. 9.

Specifically, the first gate insulating layer 103a is deposited on the substrate 101 and the first gate 102a. Materials of the first gate insulating layer 103a may be one or multiple combinations of silicon oxide, silicon nitride, a high dielectric constant dielectric material (such as aluminum oxide, hafnium oxide, zirconium oxide, and the like), and organic dielectric materials. A thickness of the first gate insulating layer 103a may be 500 nm-1000 nm, in particular 600 nm. The first gate insulating layer 103a may be formed using plasma chemical vapor deposition, magnetron sputtering or reactive sputtering, atomic layer deposition, spin coating, or the like.

Figure 10:
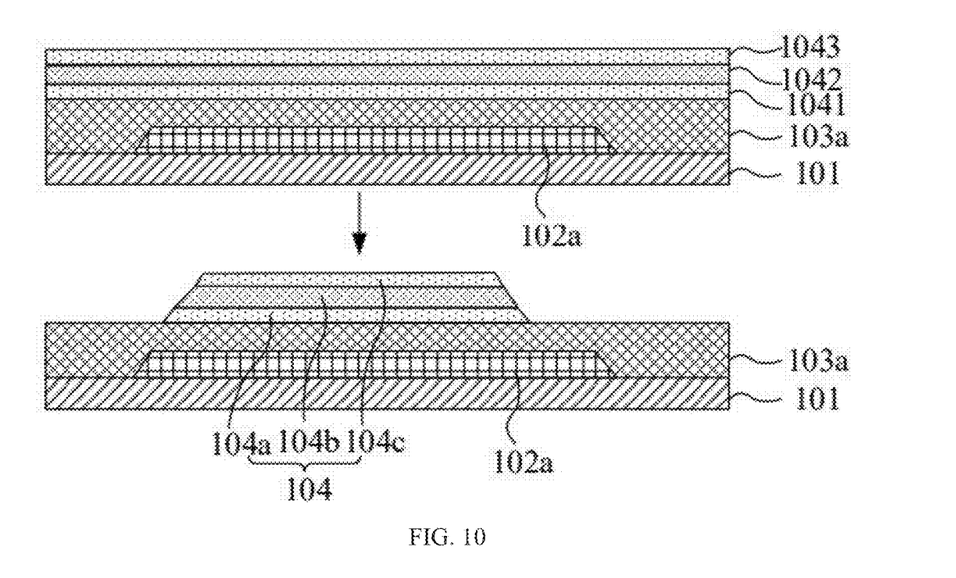

Step B04, forming an active layer 104 on the substrate 101, wherein the active layer 104 and the first gate 102a are disposed in different layers. The active layer 104 comprises at least a first sub-active layer 104a and a second sub-active layer 104b stacked. A number of gallium atoms in the first sub-active layer 104a is greater than a number of gallium atoms in the second sub-active layer, please refer to FIG. 10.

Wherein the step of forming the active layer 104 on the substrate 101 comprises:

Iridium gallium zinc oxide is formed on the substrate 101, and indium gallium zinc oxide is nitrogen doped to form the first sub-active layer 104a.

Specifically, the first oxide material layer 1041 is formed on the first gate insulating layer 103a by methods such as magnetron sputtering, reactive sputtering, atomic layer deposition, and spin coating, and the first oxide material layer 1041 is nitrogen doped by magnetron sputtering, and a thickness of the first oxide material layer 1041 is less than or equal to 15 nm.

Next, indium gallium zinc oxide is formed on the first sub-active layer 104a to form the second sub-active layer 104b.

Specifically, the second oxide material layer 1042 is formed on the first oxide material layer 1041 by methods such as magnetron sputtering, reactive sputtering, atomic layer deposition, and spin coating. A thickness of the second oxide material layer 1042 ranges from 10 nm to 90 nm.

Alternatively, the step B04 may further include forming a third oxide material layer 1043 on the second oxide material layer 1042 by methods such as magnetron sputtering, reactive sputtering, atomic layer deposition, and spin coating, and nitrogen doping the third oxide material layer 1043 by magnetron sputtering, wherein a thickness of the third oxide material layer 1043 is less than or equal to 15 nm.

Next, the first oxide material layer 1041, the second oxide material layer 1042, and the third oxide material layer 1043 are patterned to form the active layer 104. Specifically, a photoresist may be spin-coated on the third oxide material layer 1043, followed by photolithography, etching, degumming, and cleaning to obtain the active layer 104. The active layer 104 comprises a doped region and channel regions, the channel regions are located on two sides of an active region.

After the step B04, the method may further include following steps:

The second gate insulating layer 103b is formed on the active layer 104. Specifically, materials of the second gate insulating layer 103b may be one or multiple combinations of silicon oxide, silicon nitride, a high dielectric constant dielectric material (such as aluminum oxide, hafnium oxide, and zirconium oxide, etc.), and organic dielectric materials, and a thickness of the first gate insulating layer 103b may be 50 nm-500 nm, in particular 300 nm. The second gate insulating layer 103b may be formed by plasma chemical vapor deposition, magnetron sputtering or reactive sputtering, atomic layer deposition, spin coating, or the like. Please refer to FIG. 11.

Figure 11:
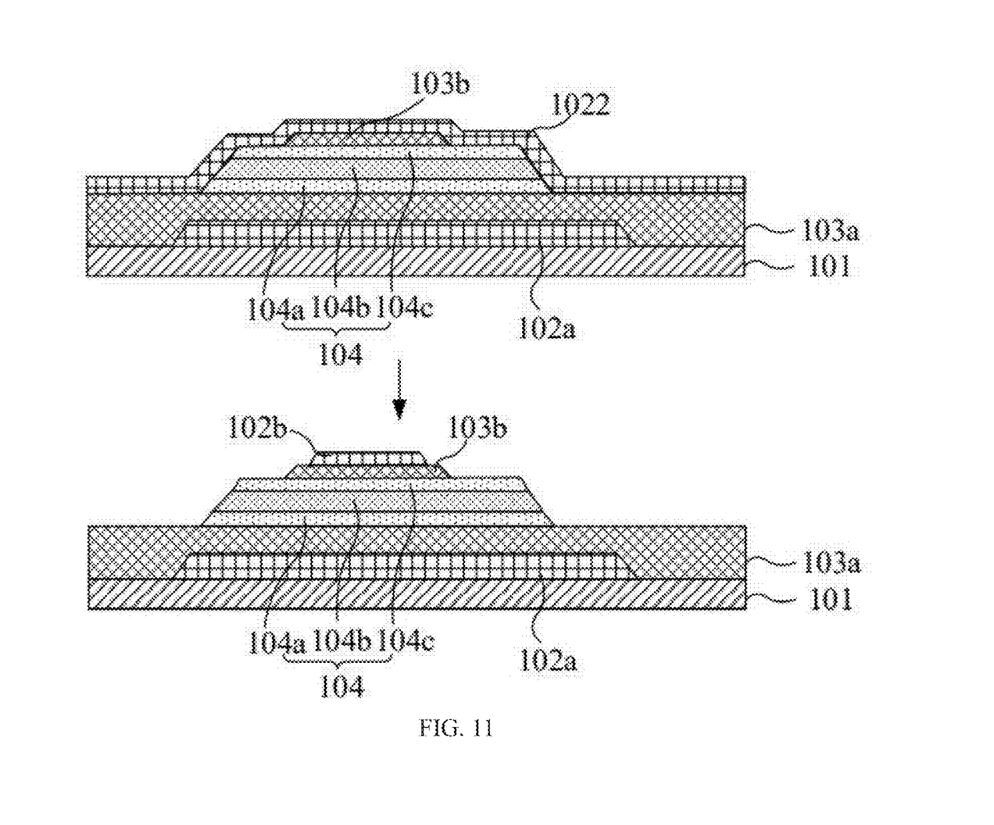

After the step of forming the second gate insulating layer 103b on the active layer 104, the method may further include:

A second gate conductive layer 1022 is deposited on the second gate insulating layer 103b. The second gate conductive layer 1022 may be formed of a single metal layer or a multilayer metal layer using simple substance or an alloy of molybdenum (Mo), copper (Cu), aluminum (Al), titanium (Ti), or chromium (Cr). The second gate conductive layer 1022 may also use non-reflective materials, such as one or multiple combinations of conductive metal oxides (such as ITO), or other conductive materials. A thickness of the second gate conductive layer 1022 may be 100 nm-800 nm, in particular 200 nm, as desired. The second gate conductive layer 1022 may be formed on the substrate 101 using techniques such as magnetron sputtering, reactive sputtering, thermal evaporation, and electron evaporation. The reflective here refers to a transmittance of at least less than 20%. Then, the second gate conductive layer 1022 may be patterned to form the second gate electrode 102b. Specifically, a photoresist is spin-coated on the second gate conductive layer 1022, followed by photolithography, degumming, cleaning, and other operations to obtain a patterned second gate 102b, please refer to FIG. 11.

Figure 12:
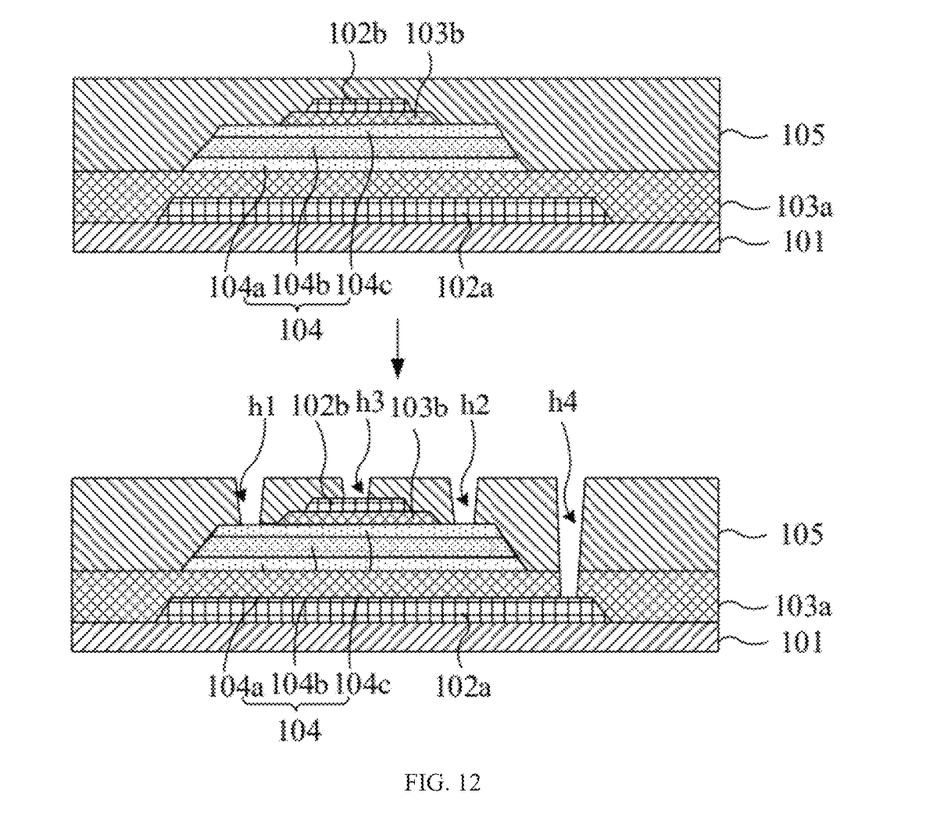
Figure 13:
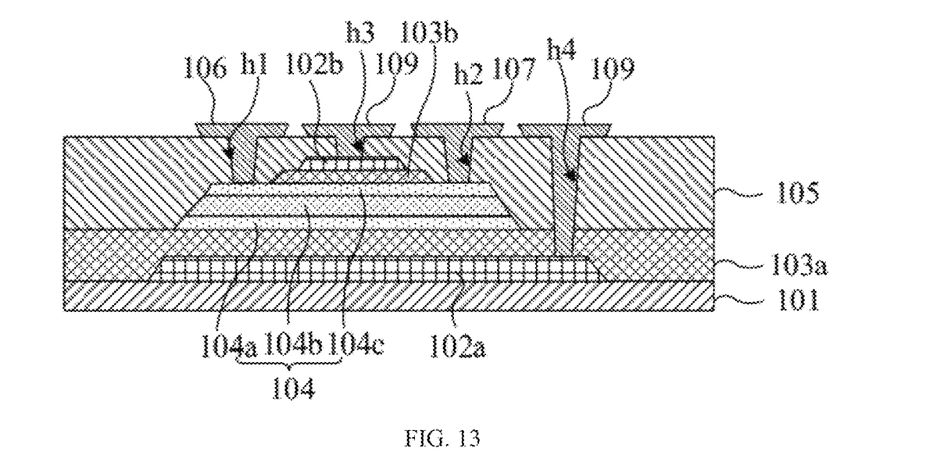

Step B05, forming an interlayer dielectric layer 105 on the substrate 101, please refer to FIG. 12.

Specifically, the interlayer dielectric layer 105 is deposited on the substrate 101 using a plasma chemical vapor deposition. Materials of the interlayer dielectric layer 105 may be one or multiple combinations of silicon oxide, silicon nitride, a high dielectric constant dielectric material such as aluminum oxide, hafnium oxide, and zirconium oxide, or organic dielectric materials. A thickness of the interlayer dielectric layer 105 may be 100 nm-1200 nm, in particular 400 nm.

Step B06, forming a first via h1 and a second via h2 on the interlayer dielectric layer 105, please refer to FIG. 12.

The step B06 further includes forming a third via h3 and a fourth via h4. Specifically, the first via h1, the second via h2, the third via h3, and the fourth via h4 are formed by a yellow light process. The first via h1, the second via h2, and the third via h3 penetrate through the interlayer dielectric layer 105, and the fourth via h4 penetrates through the interlayer dielectric layer 105 and the first gate insulating layer 103a. Specifically, the first via h1 may be a source contact hole, the second via h2 may be a drain contact hole, and the third via h3 and the fourth via h4 may serve as connection electrode contact holes.

Step B07, forming a source 106 and a drain 107 on the substrate 101, wherein the source 106 is electrically connected to the active layer 104 through the first via h1, and the drain 107 is electrically connected to the active layer 104 through the second via h2.

In one embodiment, the step B07 further includes forming a connection electrode 109. The connection electrode 109, the source 106, and the drain 107 may be formed by a same yellow light process. Specifically, an electrode conductive layer is deposited on the interlayer dielectric layer 105 and on the first via h1, the second via h2, the third via h3, and the fourth via h4 using magnetron sputtering, reactive sputtering, thermal evaporation, electron evaporation, and the like. Materials of the electrode conductive layer may be one or multiple combinations of metals (such as molybdenum, copper, aluminum, titanium, chromium, etc.), conductive metal oxides (such as ITO), or other conductive materials. Then, the source 106, the drain 107, and the connection electrode 109 are formed by etching.

After the step B07, the method further comprises forming a passivation layer 108 on the substrate 101, please refer to FIG. 3.

Specifically, the passivation layer 108 is deposited on the substrate 101 by plasma chemical vapor deposition. Materials of the passivation layer 108 may be one or multiple combinations of silicon oxide, silicon nitride, a high dielectric constant dielectric material (such as aluminum oxide, hafnium oxide, zirconium oxide, etc.), and organic dielectric materials, and a thickness of the passivation layer 108 may be 50 nm-800 nm, in particular 400 nm.

Embodiments of the present disclosure provide a display panel and a manufacturing method thereof. In the display panel provided in the embodiment of the present disclosure, the active layer is defined as three layers, i.e., the first sub-active layer, the second sub-active layer, and the third sub-active layer, wherein the number of gallium atoms in the first sub-active layer and the third sub-active layer is greater than the number of gallium atoms in the second sub-active layer. Since gallium has strong bonding ability with oxygen atoms, the occurrence of deep energy level defects can be effectively suppressed, thereby improving the stability of the device and the reliability of the display panel. The ratio of the number of indium atoms, the number of gallium atoms, and the number of zinc atoms in the second sub-active layer is indium:gallium:zinc=1:1:1, thereby ensuring the conductivity and the mobility of the display panel.

In summary, although preferred embodiments have been described above in the present disclosure, the above-mentioned preferred embodiments are not intended to limit the present disclosure. Those of ordinary skilled in the art can make various modifications and changes without departing from the spirit and scope of the present disclosure. Therefore, the protection scope of the present disclosure is subject to the scope defined by the claims.

What is claimed is:

1. A display panel, wherein the display panel comprises:
   a substrate;
   a first gate, wherein the first gate is disposed on the substrate;
   a first gate insulating layer, wherein the first gate insulating layer is disposed on the substrate and covers the first gate;
   an active layer, wherein the active layer is disposed on the first gate insulating layer, the active layer comprises at least a first sub-active layer, and a second sub-active layer and a third sub-active layer that are stacked, the first sub-active layer is disposed on the first gate insulating layer, the second sub-active layer is disposed on the first sub-active layer, and the third sub-active layer is disposed on the second sub-active layer; a material of the first sub-active layer comprises indium gallium zinc oxide, wherein a ratio of a number of indium atoms, a number of gallium atoms, and a number of zinc atoms in the first sub-active layer is indium:gallium:zinc=M:1:N, wherein $0<M<1$, $0<N<1$; a material of the second sub-active layer comprises indium gallium zinc oxide, wherein a ratio of a number of indium atoms, a number of gallium atoms, and a number of zinc atoms in the second sub-active layer is indium:gallium:zinc=1:1:1;
   an interlayer dielectric layer disposed on the first gate insulating layer and covering the active layer;
   a first via, wherein the first via penetrates at least the interlayer dielectric layer;
   a second via, wherein the second via penetrates at least the interlayer dielectric layer;
   a source, wherein the source is disposed on the interlayer dielectric layer and electrically connected to the active layer through the first via;
   a drain, wherein the drain is disposed on the interlayer dielectric layer and electrically connected to the active layer through the second via;
   a second gate insulating layer, wherein the second gate insulating layer is disposed on the active layer;
   a second gate, wherein the second gate is disposed on the second gate insulating layer;
   a third via, wherein the third via penetrates the interlayer dielectric layer;
   a fourth via, wherein the fourth via penetrates the interlayer dielectric layer and the first gate insulating layer; and
   a connection electrode, wherein the connection electrode is disposed in the third via and the fourth via for connecting the first gate and the second gate.

2. The display panel according to claim 1, wherein a ratio of a number of indium atoms, a number of gallium atoms, and a number of zinc atoms in the third sub-active layer is indium:gallium:zinc=X:1:Y, $0<X<1$, $0<Y<1$.

3. The display panel according to claim 2, wherein the first sub-active layer comprises a nitrogen-doped indium gallium zinc oxide active layer, and the third sub-active layer comprises a nitrogen-doped indium gallium zinc oxide active layer.

4. The display panel according to claim 1, wherein a thickness of the first sub-active layer and a thickness of the third sub-active layer are less than or equal to 15 nm, and a thickness of the second sub-active layer ranges from 10 nm to 90 nm.

5. The display panel according to claim 2, wherein the number of gallium atoms in the third sub-active layer is equal to the number of gallium atoms in the first sub-active layer.

6. The display panel according to claim 1, wherein the display panel further comprises:
   a passivation layer, wherein the passivation layer is disposed on the interlayer dielectric layer;
   a contact electrode, wherein the contact electrode is disposed on the passivation layer, one end of the contact electrode is connected to the drain;
   a planarization layer, wherein the planarization layer is disposed on the passivation layer;
   an anode disposed on the planarization layer, wherein another end of the contact electrode is connected to the anode;
   a pixel definition layer, wherein the pixel definition layer is disposed on the planarization layer and covers a portion of the anode;
   a light-emitting layer, wherein the light-emitting layer is disposed within an opening of the pixel definition layer; and
   a cathode, wherein the cathode is disposed on the light-emitting layer.

7. A display panel, wherein the display panel comprises:
   a substrate;
   a first gate, wherein the first gate is disposed on the substrate;
   a first gate insulating layer, wherein the first gate insulating layer is disposed on the substrate and covers the first gate;
   an active layer comprising at least a first sub-active layer and a second sub-active layer that are stacked, the first sub-active layer is disposed on the first gate insulating layer, and the second sub-active layer is disposed on the first sub-active layer; a material of the first sub-active layer comprises indium gallium zinc oxide, wherein a ratio of a number of indium atoms, a number of gallium atoms, and a number of zinc atoms in the first sub-active layer is indium:gallium:zinc=M:1:N, wherein $0<M<1$, $0<N<1$; a material of the second sub-active layer comprises indium gallium zinc oxide, wherein a ratio of a number of indium atoms, a number of gallium atoms, and a number of zinc atoms in the second sub-active layer is indium:gallium:zinc=1:1:1;
   an interlayer dielectric layer disposed on the first gate insulating layer and covering the active layer;
   a first via, wherein the first via penetrates at least the interlayer dielectric layer;
   a second via, wherein the second via penetrates at least the interlayer dielectric layer;
   a source, wherein the source is disposed on the interlayer dielectric layer and electrically connected to the active layer through the first via;
   a drain, wherein the drain is disposed on the interlayer dielectric layer and electrically connected to the active layer through the second via;
   a passivation layer, wherein the passivation layer is disposed on the interlayer dielectric layer;
   a contact electrode, wherein the contact electrode is disposed on the passivation layer, one end of the contact electrode is connected to the drain;
   a planarization layer, wherein the planarization layer is disposed on the passivation layer;
   an anode disposed on the planarization layer, wherein another end of the contact electrode is connected to the anode;
   a pixel definition layer, wherein the pixel definition layer is disposed on the planarization layer and covers a portion of the anode;
   a light-emitting layer, wherein the light-emitting layer is disposed within an opening of the pixel definition layer; and
   a cathode, wherein the cathode is disposed on the light-emitting layer.

8. The display panel according to claim 7, wherein the active layer further comprises:
   a third sub-active layer, wherein the third sub-active layer is disposed on the second sub-active layer, a ratio of a number of indium atoms, a number of gallium atoms, and a number of zinc atoms in the third sub-active layer is indium:gallium:zinc=X:1:Y, $0<X<1$, $0<Y<1$.

9. The display panel according to claim 8, wherein the first sub-active layer comprises a nitrogen-doped indium gallium zinc oxide active layer, and the third sub-active layer comprises a nitrogen-doped indium gallium zinc oxide active layer.

10. The display panel according to claim 7, wherein the display panel further comprises:
    a second gate insulating layer, wherein the second gate insulating layer is disposed on the active layer;
    a second gate, wherein the second gate is disposed on the second gate insulating layer;
    a third via, wherein the third via penetrates the interlayer dielectric layer;
    a fourth via, wherein the fourth via penetrates the interlayer dielectric layer and the first gate insulating layer; and
    a connection electrode, wherein the connection electrode is disposed in the third via and the fourth via for connecting the first gate and the second gate.

11. The display panel according to claim 8, wherein a thickness of the first sub-active layer and a thickness of the third sub-active layer are less than or equal to 15 nm, and a thickness of the second sub-active layer ranges from 10 nm to 90 nm.

12. The display panel according to claim 8, wherein the number of gallium atoms in the third sub-active layer is equal to the number of gallium atoms in the first sub-active layer.

* * * * *